United States Patent
Chen et al.

(10) Patent No.: US 9,040,891 B2
(45) Date of Patent: May 26, 2015

(54) IMAGE DEVICE AND METHODS OF FORMING THE SAME

(75) Inventors: U-Ting Chen, Wanluan Township (TW); Dun-Nian Yaung, Taipei (TW); Jen-Cheng Liu, Hsinchu (TW); Yu-Hao Shih, Tainan (TW); Chih-Chien Wang, Changhua (TW); Shih Pei Chou, Tainan (TW); Wei-Tung Huang, Tainan (TW); Cheng-Ta Wu, Shueishang Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 339 days.

(21) Appl. No.: 13/492,348

(22) Filed: Jun. 8, 2012

(65) Prior Publication Data

US 2013/0327921 A1    Dec. 12, 2013

(51) Int. Cl.
*H01L 27/00* (2006.01)
*H01L 21/033* (2006.01)
*H01L 27/146* (2006.01)

(52) U.S. Cl.
CPC ........ *H01L 21/0334* (2013.01); *H01L 21/0337* (2013.01); *H01L 27/14603* (2013.01); *H01L 27/1464* (2013.01); *H01L 27/14689* (2013.01)

(58) Field of Classification Search
CPC .... H01L 27/146; H01L 27/1463; H01L 31/18
USPC ............ 250/208.1, 214.1; 257/446, 447, 257/E31.11, E31.128; 438/73
See application file for complete search history.

(56) References Cited

U.S. PATENT DOCUMENTS

| | | | |
|---|---|---|---|
| 7,029,942 B2 | 4/2006 | Lee | |
| 7,602,034 B2 | 10/2009 | Park | |
| 2002/0064943 A1 | 5/2002 | Iguchi et al. | |
| 2010/0148290 A1 | 6/2010 | Park | |
| 2010/0252870 A1* | 10/2010 | Lin et al. | 257/291 |
| 2014/0151835 A1* | 6/2014 | Huang et al. | 257/432 |

FOREIGN PATENT DOCUMENTS

| | | |
|---|---|---|
| JP | 2004-282043 A | 10/2004 |
| JP | 2006-157019 A | 6/2006 |

OTHER PUBLICATIONS

Notice of Allowance dated May 27, 2014 and English translation from corresponding application No. KR 10-2012-0148157.
Copy of Office Action dated Mar. 9, 2015 from corresponding no. CN 1021141345.

* cited by examiner

*Primary Examiner* — Kevin Pyo
(74) *Attorney, Agent, or Firm* — Lowe Hauptman & Ham, LLP

(57) ABSTRACT

A method of forming of an image sensor device includes a substrate having a pixel region and a periphery region. A plurality of first trenches is etched in the periphery region. Each of the first trenches has a depth $D_1$. A mask layer is formed over the substrate. The mask layer has a plurality of openings in the pixel region. A spacer is formed in an interior surface of each opening. A plurality of second trenches is etched through each opening having the spacer in the pixel region. Each of the second trenches has a depth $D_2$. The depth $D_1$ is larger than the depth $D_2$.

20 Claims, 9 Drawing Sheets

IMAGE DEVICE AND METHODS OF FORMING THE SAME

TECHNICAL FIELD

This disclosure relates to an image sensor device and methods for forming an image sensor device.

BACKGROUND

An image sensor device is one of the building blocks in a digital imaging system such as a digital still or video camera. An image sensor device includes a pixel array (or grid) for detecting light and recording intensity (brightness) of the detected light. The pixel array responds to the light by accumulating a charge—for example, the more light, the higher the charge. The accumulated charge is then used (for example, by other circuitry) to provide a color and brightness for use in a suitable application, such as a digital camera. One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid.

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device.

Due to device scaling, improvements to BSI technology are continually being made to further improve image quality of BSI image sensor devices. Although existing BSI image sensor devices and methods of fabricating BSI image sensor devices have been generally adequate for their intended purposes, as device scaling down continues, they have not been entirely satisfactory in all respects.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the present disclosure. Specific examples of components are arrangements, which are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Further still, references to relative terms such as "top," "front," "bottom," and "back" are used to provide a relative relationship between elements and are not intended to imply any absolute direction. Various features may be arbitrarily drawn in different scales for simplicity and clarity.

A plurality of semiconductor chip regions is divided on a substrate by scribe lines between the chip regions. The substrate will go through a variety of cleaning, layering, patterning, etching and doping steps to form image sensor devices. The term "substrate" herein generally refers to the bulk substrate on which various layers and device structures may be formed. In some embodiments, the substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits An image sensor device 100 has a pixel region and a periphery region according to one embodiment of this disclosure. In the depicted embodiment, the image sensor device 100 is a backside illuminated (BSI) image sensor device. The image sensor device 100 includes a substrate having various doping configurations depending on design requirements (e.g., p-type substrate or n-type substrate). In some embodiments, the p-type refers to making holes as majority charge carriers in a semiconductor material, and the n-type refers to making electrons as majority charge carriers in a semiconductor material.

Figure 1A:
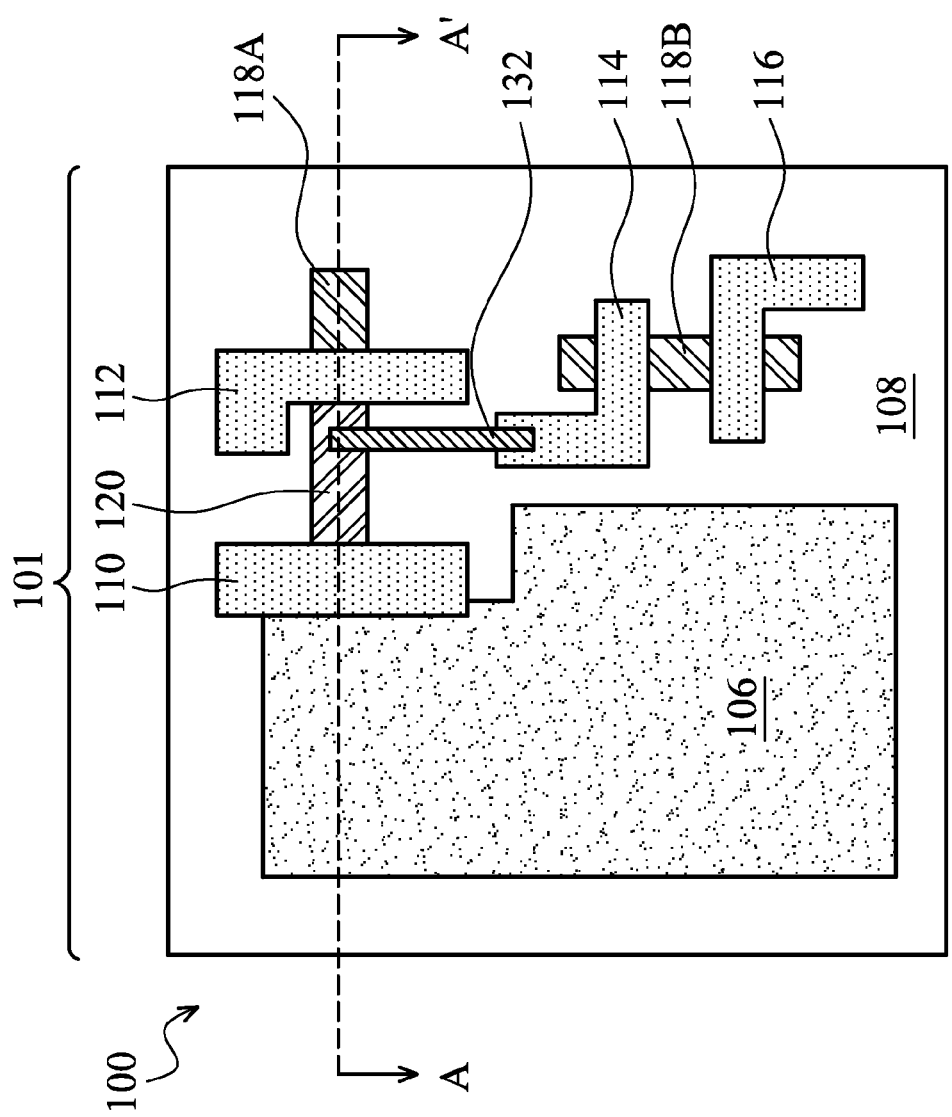
FIG. 1A is an enlarged top view of a pixel region in an image sensor device according to one or more embodiments of this disclosure.
Figure 1B:
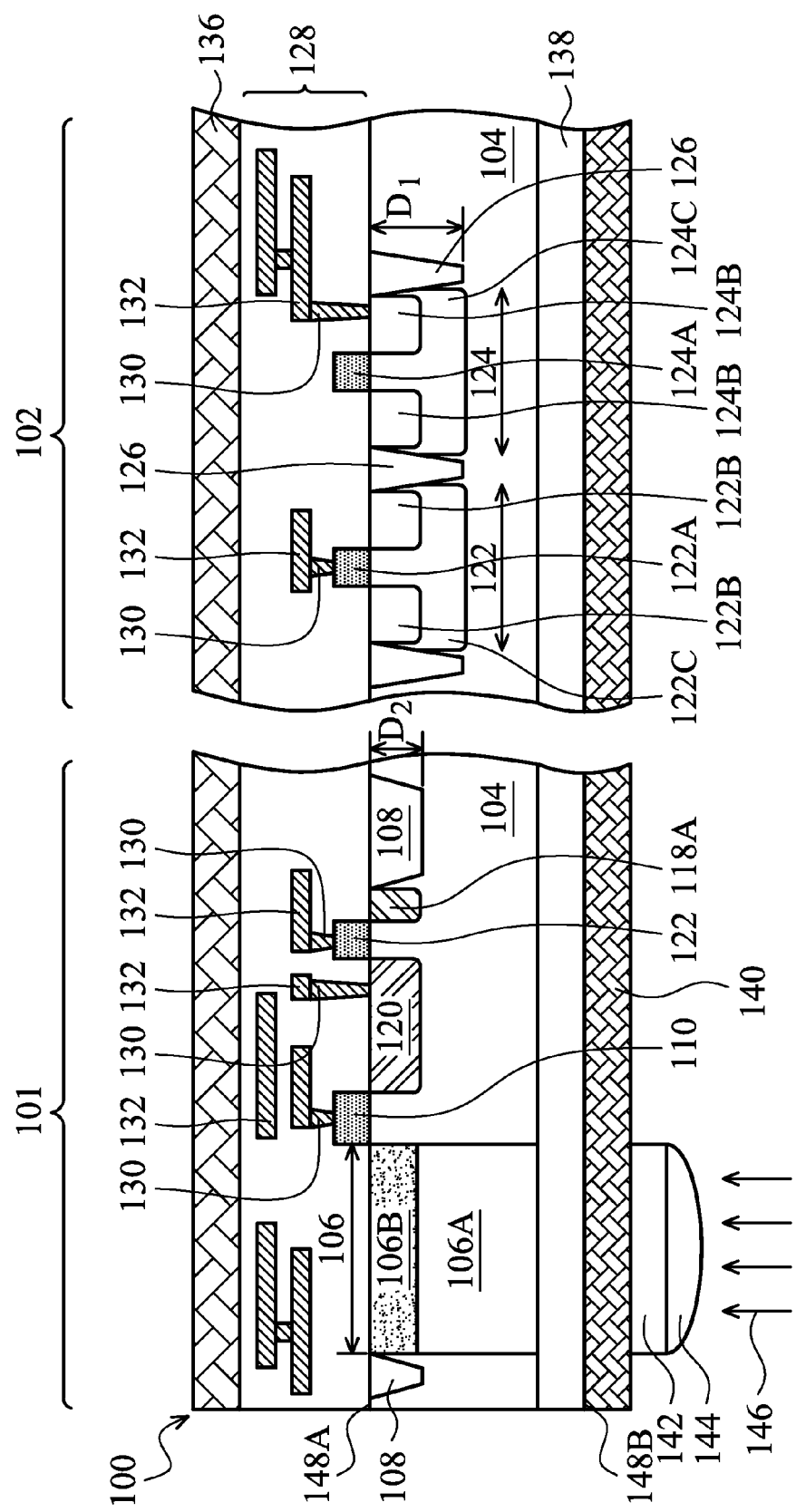
FIG. 1B is a cross sectional view of the pixel region along line A-A' in FIG. 1A and a periphery region of the image sensor device according to one or more embodiments of this disclosure

FIG. 1A is an enlarged top view of a pixel region 101 in the image sensor device 100 on a substrate 104 (illustrated in FIG. 1B). The image sensor device 100 includes an array of pixels 101 shown in FIG. 1A. Each pixel region 101 is arranged into a column and a row. The pixel region 101 refers to a unit cell containing at least one photodetector 106 and various circuitry for converting electromagnetic radiation to an electrical signal. In the depicted embodiment, the photodetector 106 includes a photodiode for recording an intensity or brightness of light (radiation). The pixel region 101 may contain various transistors including a transfer transistor 110, a reset transistor 112, a source-follower transistor 114, a select transistor 116, or other suitable transistor, or combination thereof. The pixel region 101 may also include various doped regions in the substrate, for example doped region 118A, 118B and 120. The doped regions (118A, 118B and 120) are configured as source/drain regions of previous mentioned transistors. The doped region 120 is also referred to as a floating diffusion region 120, which is between the transfer transistor 110 and the reset transistor 112. A conductive feature 132 overlaps a portion of a gate stack of the source-follower transistor 114 and connects to the floating diffusion region 120. The image sensor device 100 also includes various isolation features formed in the substrate to isolate various regions of the substrate. In the depicted embodiment, an isolation feature 108 is formed in the pixel region 101 to isolate the photodetector 106, the transfer transistor 110, the reset transistor 112, the source-follower transistor 114 and the select transistor 116. Additional circuitry, input, and/or output in a periphery region may be coupled to the pixel array to provide an operation environment for the pixel region 101 and support external communications with the pixel region 101. For example, the pixel array may be coupled with readout circuitry and/or control circuitry in the periphery region. For simplicity, image sensor devices including a single pixel region 101 are described in the present disclosure; however, typically an array of such pixels may form the image sensor device 100 illustrated in FIG. 1A.

FIG. 1B is a cross sectional view of the pixel region 101 along line A-A' in FIG. 1A and a periphery region 102 of the image sensor device 100. The image sensor device 100 includes the substrate 104 having a front surface 104A and a back surface 104B. In the depicted embodiment, the substrate 104 is a semiconductor substrate including silicon. Alternatively or additionally, the substrate 104 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 104 may be a semiconductor on insulator (SOI). In the depicted embodiment, the substrate 104 is a p-type substrate. P-type dopants that the substrate 104 is doped with include boron, gallium, indium, other suitable p-type dopants, or combinations thereof. The substrate 104 may alternatively be an n-type doped substrate. N-type dopants that the substrate 104 can be doped with include phosphorus, arsenic, other suitable n-type dopants, or combinations thereof. Doping may be implemented using a process such as ion implantation or diffusion in various steps and techniques.

The pixel region 101 includes at least one photodetector 106, such as a photodiode, that includes a light-sensing region 106A and a pinned layer 106B. The light-sensing region 106A is a doped region having n-type and/or p-type dopants formed in the substrate 104, specifically along the front surface 104A of the substrate 104. In the depicted embodiment, the light-sensing region 106A is an n-type doped region. The pinned layer 106B is a doped layer disposed overlapping the light-sensing region 106A at the front surface 104A of the substrate 104. In the depicted embodiment, the pinned layer 106B is a p-type implanted layer.

The pixel region 101 further includes various transistors, such as the transfer transistor 110, the reset transistor 112, the source-follower transistor 114 (shown in FIG. 1A) and the select transistor 116 (shown in FIG. 1A). Each transistor has a corresponding gate stack disposed over the front surface 104A of the substrate 104. The gate stack of the transfer transistor 110 overlies a portion of the light-sensing region 106A. The pixel region 101 also includes various doped regions in the substrate 104. The doped regions correspond to gate stacks of previous mentioned transistors as source/drain regions. For example, doped regions 120 and 118A are source/drain regions of the reset transistor 112. The doped region 120 is also referred as a floating diffusion region 120. The floating diffusion region 120 is between the transfer transistor 110 and the reset transistor 112. The floating diffusion region 120 may convert the accumulated charges from the photodetector 106 to voltage signals for the source-follower transistor 114 (shown in FIG. 1A). In the depicted embodiment, the floating diffusion region 120 is an n-type doped region. The gate stack of each transistor includes a gate dielectric layer and a gate electrode layer. The gate dielectric layer includes a dielectric material, such as silicon oxide, a high-k dielectric material, other dielectric material, or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy or combinations thereof. The gate electrode layer includes polysilicon and/or a metal including Al, Cu, Ti, Ta, W, Mo, TaN, NiSi, CoSi, TiN, WN, TiAl, TiAlN, TaCN, TaC, TaSiN or combinations thereof.

The periphery region 102 may include readout circuitry and/or control circuitry coupled to the pixel region 101 to provide an operational environment for the pixel region 101. In the depicted embodiment, a PMOS transistor 122 and a NMOS transistor 124 are shown. The PMOS transistor 122 includes a gate stack 122A and source/drain regions 122B formed in an n-type well 122C. The NMOS transistor 124 includes a gate stack 124A and source/drain regions 124B formed in a p-type well 124C.

The image sensor device 100 further includes a plurality of first isolation features 126 formed in substrate 104 of the periphery region 102 and a plurality of second isolation features 108 formed in substrate 104 of the pixel region 101. The first isolation features 126 and the second isolation features 108 isolate various regions of the substrate 104. In the depicted embodiment, the first isolation features 108 and the second isolation features 126 isolate the PMOS transistor 122 and the NMOS transistor 124, the photodetector 106, the transfer transistor 110, the reset transistor 112, the source-follower transistor 114 (shown in FIG. 1A) and the select transistor 116 (shown in FIG. 1A). The first isolation features 126 and the second isolation features 108 include silicon oxide, silicon nitride, silicon oxynitride, other insulating material, or combination thereof. Each of the first isolation features 126 has a depth $D_1$ extending from the front surface 104A into the substrate 104. The depth $D_1$ is in a range of about 2000 Å to about 3500 Å. Each of the second isolation features 108 has a depth $D_2$ extending from the front surface 104A into the substrate 104. The depth $D_2$ is in a range of about 1000 Å to about 1500 Å. The depth $D_1$ is larger than the depth $D_2$.

The image sensor device 100 further includes a multilayer interconnect (MLI) 128 disposed over the front surface 104A of the substrate 104, including over the photodetector 106. The MLI 128 is coupled to various components of the image sensor device 100, such as the photodetector 106, such that the various components of the mage sensor device 100 are operable to properly respond to illuminated light (imaging radiation). The MLI 128 includes various conductive features, which may be vertical interconnects 130, such as contacts and/or vias 130, and horizontal interconnects 132, such as lines 132. The various conductive features 130 and 132 include conductive materials, such as aluminum, aluminum/silicon/copper alloy, titanium, titanium nitride, tungsten, polysilicon, metal silicide, or combinations thereof.

The various conductive features 130 and 132 of the MLI 128 are embedded in an interlayer dielectric (ILD) layer 134. The ILD layer 134 may include silicon dioxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, BLACK DIAMOND® (Applied Materials of Santa Clara, Calif.), amorphous fluorinated carbon, low-k dielectric material, polyimide, or combinations thereof. The ILD layer 134 may have a multilayer structure.

A carrier wafer 136 is disposed over the front surface 104A of the substrate 104. In the depicted embodiment, the carrier wafer 136 is bonded to the MLI 128. The carrier wafer 136 includes silicon or glass. The carrier wafer 136 can provide protection for the various features (such as the photodetector 106) formed on the front surface 104A of the substrate 104, and can also provide mechanical strength and support for processing the back surface 104B of the substrate 104.

The image sensor device 100 further includes a doped layer 138 is disposed at the back surface 104B of the substrate 104. The doped layer 138 is formed by an implantation process, diffusion process, annealing process or combinations thereof. In the depicted embodiment, the doped layer 138 includes p-type dopants, such as boron, gallium, indium or combinations thereof. The doped layer 138 has a dopant depth, d, that extends into the substrate 104 from the back surface 104B of the substrate 104. The dopant depth, dopant concentration, dopant profile, or combination thereof of the doped layer 138 may be selected to optimize image quality by increasing quantum efficiency, reducing dark current or reducing white pixel defects.

The image sensor device 100 may further include an antireflective layer 140, a color filter 142 and a lens 144 disposed over the back surface 104B of the substrate 104. The antireflective layer 140 includes a dielectric material, such as silicon nitride or silicon oxynitride.

The color filter 142 is disposed over the antireflective layer 140, and is aligned with the light-sensing region 106A of the photodetector 106. The color filter 142 is designed so that it filters through light of a predetermined wavelength. For example, the color filter 142 may filter through visible light of a red wavelength, a green wavelength, or a blue wavelength to the photodetector 106. In an example, the color filter 142 includes a dye-based (or pigment-based) polymer for filtering out a specific frequency band (for example, a desired wavelength of light).

The lens 144 is disposed over the color filter 142 and is also aligned with the light-sensing region 106A of the photodetector 106. The lens 144 may be in various positional arrangements with the photodetector 106 and color filter 142, such that the lens 144 focuses an incident radiation 146 on the light-sensing region 106A of the photodetector 106. Alternatively, the position of the color filter layer 142 and the lens 144 may be reversed, such that the lens 144 is disposed between the antireflective layer 140 and color filter 142.

In an operation according to one or more embodiments, the image sensor device 100 is designed to receive a radiation 146 traveling towards the back surface 104B of the substrate 104. The lens 144 directs the incident radiation 146 to the color filter 142. The incident radiation 146 then passes from the color filter 142 through the antireflective layer 140 to the substrate 104 and the corresponding photodetector 106, specifically to light-sensing region 106A. When exposed to the incident radiation 146, the photodetector 106 responds to the incident radiation 146 by accumulating charges. When the gate of transfer transistor 110 is turned on, the charges are transferred from the photodetector 106 to the floating diffusion region 120. Through the connection of the conductive feature 132 (shown in FIG. 1A), the source-follower transistor 114 may convert the charges from the floating diffusion region 120 to voltage signals. The select transistor 116 may allow a single row of the pixel array to be read by read-out electronics. The reset transistor 112 acts as a switch to reset the floating diffusion region 120. When the reset transistor 112 is turned on, the floating diffusion region 120 is effectively connected to a power supply clearing all integrated charges.

Figure 2:
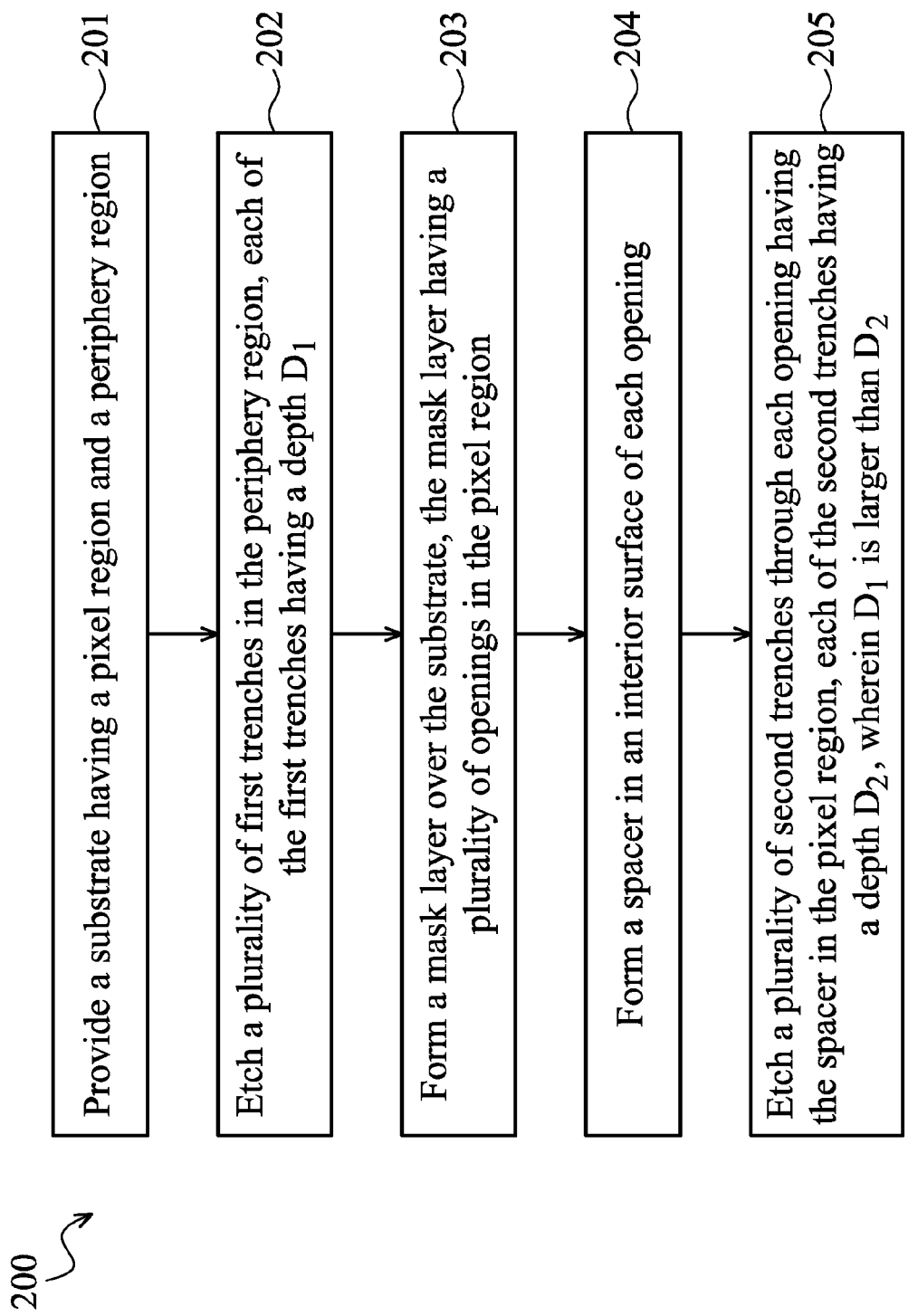
FIG. 2 is a flowchart of a method of forming an image sensor device according to one or more embodiments of this disclosure.

FIG. 2 is a flowchart of a method 200 of forming an image sensor device according to one or more embodiments of this disclosure. As shown in the flowchart of the method 200, at operation 201 a substrate having a pixel region and a periphery region is provided. Next, the method 200 continues with operation 202 in which a plurality of first trenches are etched in the periphery region. Each of the first trenches has a depth $D_1$. The method 200 continues with operation 203 in which a mask layer is formed over the substrate. The mask layer has a plurality of openings in the pixel region. The method 200 continues with operation 204 in which a spacer is formed in an interior surface of each opening. The method 200 continues with operation 205 in which a plurality of second trenches are etched through each opening having the spacer in the pixel region. Each of the second trenches has a depth $D_2$. The depth $D_1$ is larger than the depth $D_2$. In some embodiments, the method 200 may go through the sequence of operations 201, 203, 204, 205 and 202. The operation 202 could be performed as the last operation after the operation 205. Further, it is understood that additional steps can be provided before, during, and after the method 200.

FIGS. 3 to 8 are cross-sectional views of the image sensor device 100 at various stages of manufacture according to various embodiments of the method of FIG. 2. Various figures have been simplified for a better understanding of the inventive concepts of the preset disclosure.

Figure 3:
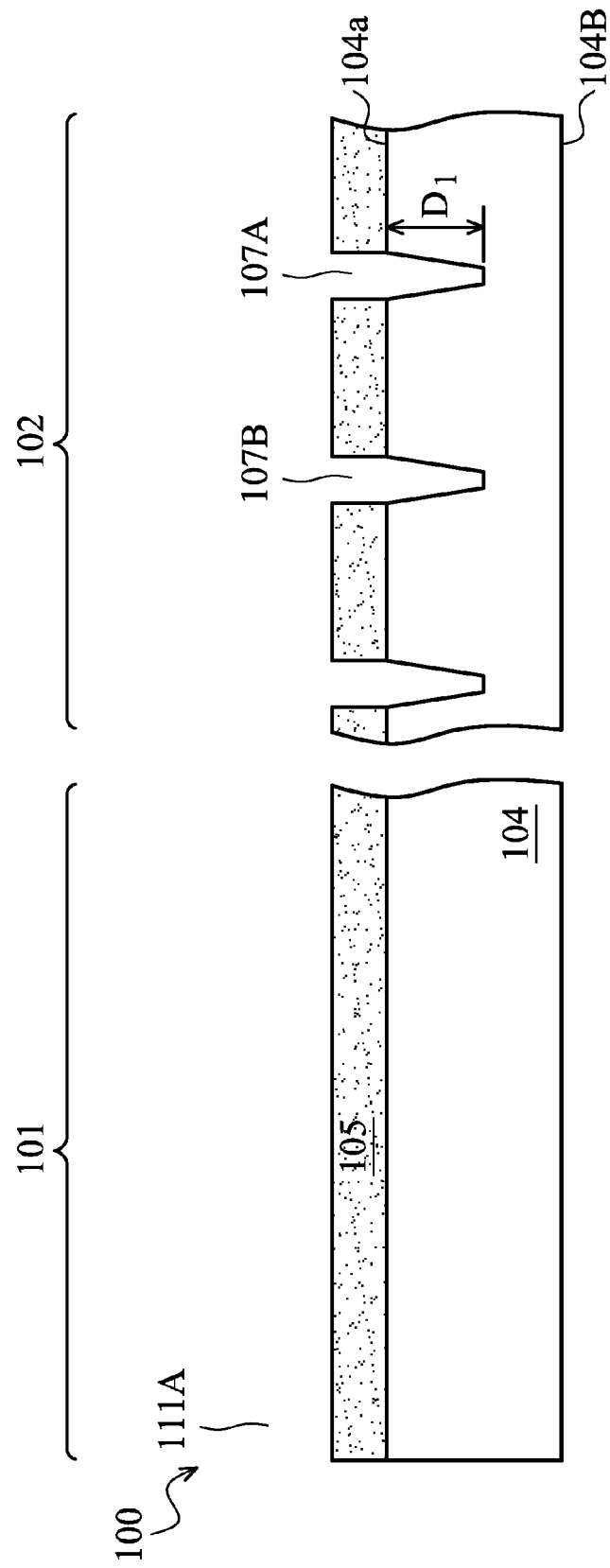
FIGS. 3 to 8 are cross-sectional views of the image sensor device at various stages of manufacture according to various embodiments of the method of FIG. 2.

The method 200 proceeds from operation 201 and continues to operation 202. FIG. 3 is a cross-sectional view of the image sensor device 100 after performing operations 201 and 202. A substrate 104 has a front surface 104A and a back surface 104B. A pixel region 101 and a periphery region 102 are assigned in the substrate 104. The substrate 104 is a semiconductor substrate including silicon. In the depicted embodiment, the substrate 104 is a p-type silicon substrate. P-type dopants that the substrate 104 is doped with include boron, gallium, indium, other suitable p-type dopants, or combinations thereof. Alternatively, the substrate 104 includes suitable materials mentioned above.

A hard mask layer 105 is formed over the front surface 104A of the substrate 104. The hard mask layer 105 may have multilayer structure. In the depicted embodiment, hard mask layer 105 includes a pad layer (not shown), a dielectric layer (not shown) over the pad layer, and an imaging enhancement layer (not shown) over the dielectric layer. The pad layer, such as oxide layer, acts as a stress buffer layer between the substrate 104 and the overlying dielectric layer. The dielectric layer comprising a nitrogen-containing material, such as silicon nitride or silicon oxynitride. Alternatively, the dielectric layer includes an amorphous carbon material, silicon carbide or tetraethylorthosilicate (TEOS). The imaging enhancement layer may include an organic layer, a polymer material or silicon-rich oxide (SRO). The imaging enhancement layer can enhance the accuracy of image transfer from an overlying photoresist layer. The hard mask layer 105 is formed through a process such as chemical vapor deposition (CVD) or plasma enhanced chemical vapor deposition (PECVD). Then, the hard mask layer 105 is patterned through suitable photolithographic and etching processes to form a plurality of holes 107A and expose a portion of the front surface 104A of the substrate 104 in the periphery region 102.

The exposed portion of the substrate 104 through the holes 107A are removed by a suitable etching process such reactive ion etching (REI) to form a plurality of first trenches 107B in the periphery region 102. Each of the first trenches 107B has a depth $D_1$ extending form the front surface 104A into the substrate 104. The depth $D_1$ is in a range of about 2000 Å to about 3500 Å.

Figure 4:
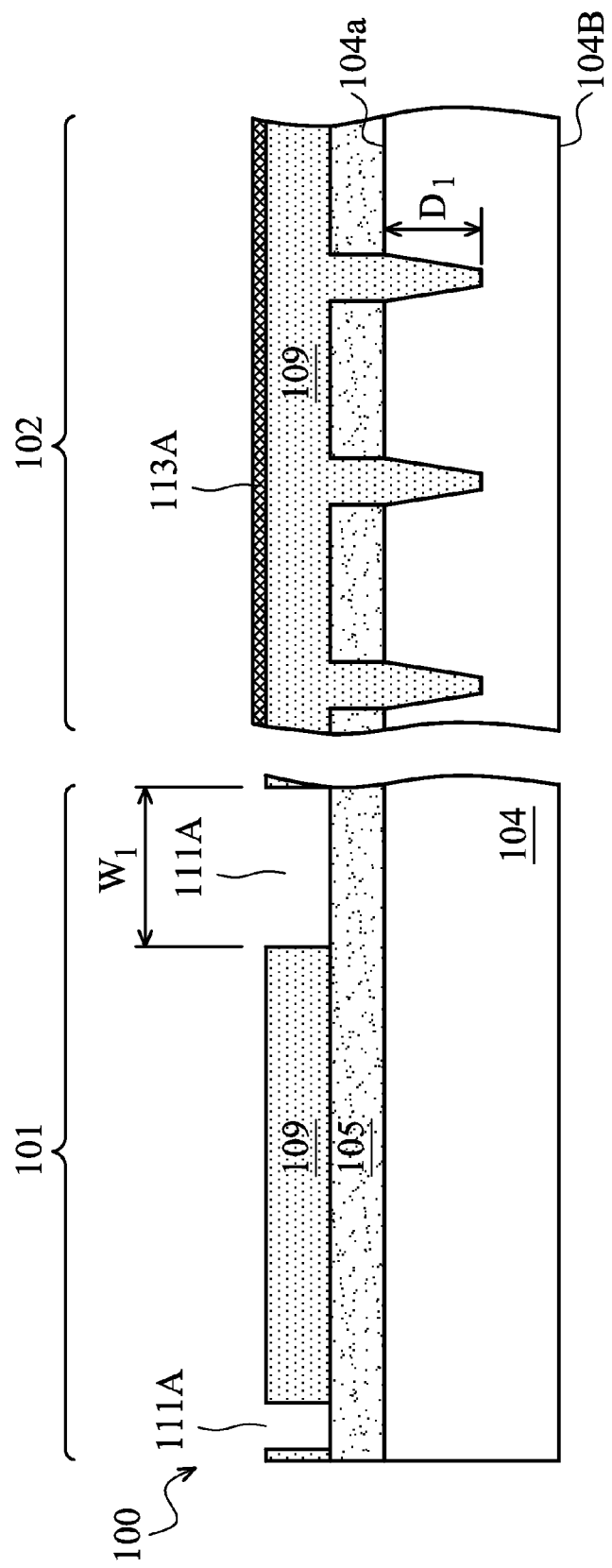

The method 200 continues with operation 203 in which a mask layer is formed over the substrate. The mask layer has a plurality of openings in the pixel region. The mask layer has a plurality of openings. FIG. 4 is a cross-sectional view of the image sensor device 100 after performing operation 203. A mask layer 109 is formed over the hard mask layer 105. The mask layer 109 overfills the first trenches 107B and the holes 107A to a level higher than a top surface 105A of the hard mask layer 105. A plurality of openings 111A are formed in the mask layer 109 to expose a portion of the top surface 105A of the hard mask layer 105 in the pixel region 101. Each of the openings 111A has an interior surface and a width $W_1$. The mask layer 109 includes a photo resist material or a dielectric material which has different etching resistance to the underlying hard mask layer 105. The mask layer is patterned through suitable photolithographic and/or etching processes to form the plurality of openings 111A.

In the depicted embodiment, a first photo resist layer (not shown) is formed and patterned. The first photo resist layer overfills the first trenches 107B and the holes 107A and exposes the hard mask layer 105 in the pixel region 101. Next, a second photo resist layer is formed on the first photo resist layer and the exposed hard mask layer 105. The second photo resist layer is patterned through suitable photolithographic processes to form the plurality of openings 111A. Advantageously, the first photo resist layer fills the first trenches 107B and the holes 107A in the periphery region 102 to form a smooth surface. The smooth surface of the first photo resist layer is substantially planar to the top surface 105A of the exposed hard mask layer 105. The smooth surface of the first photo resist layer enhances the capability to achieve a better resolution of the lithography process of the second photo resist layer for forming the openings 111A.

Figure 5:
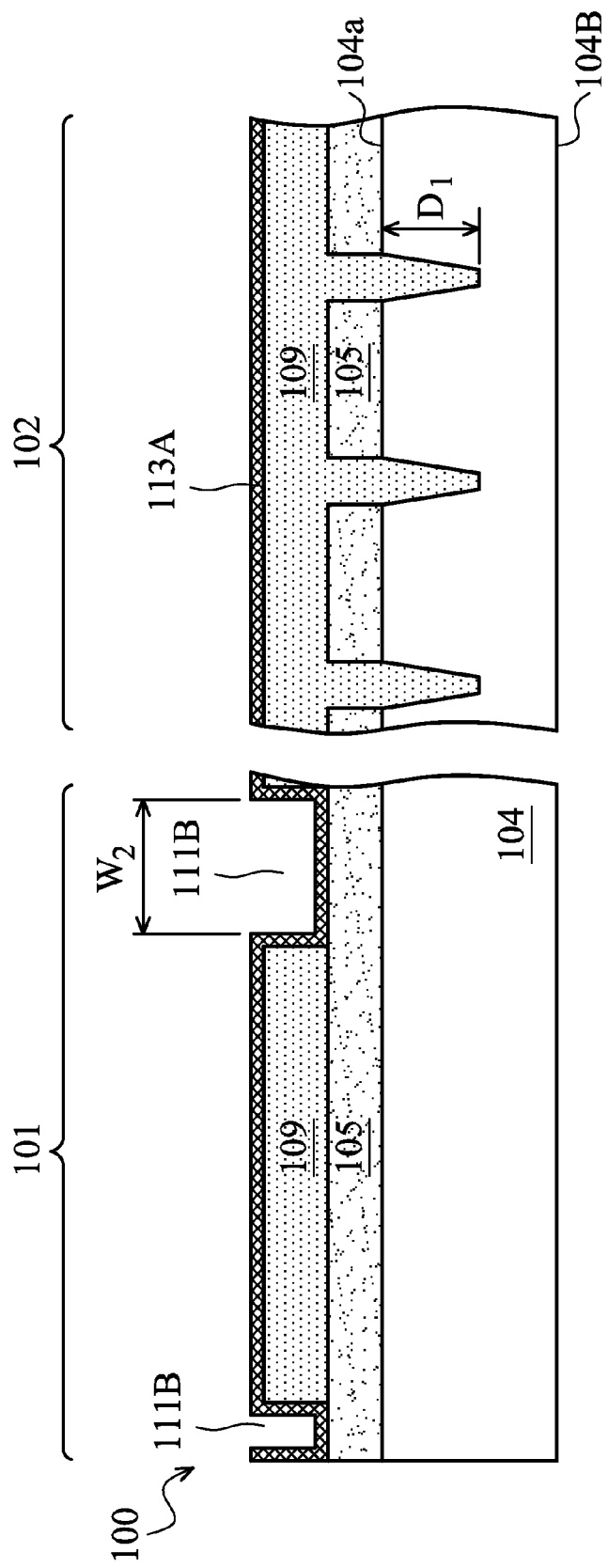
Figure 6:
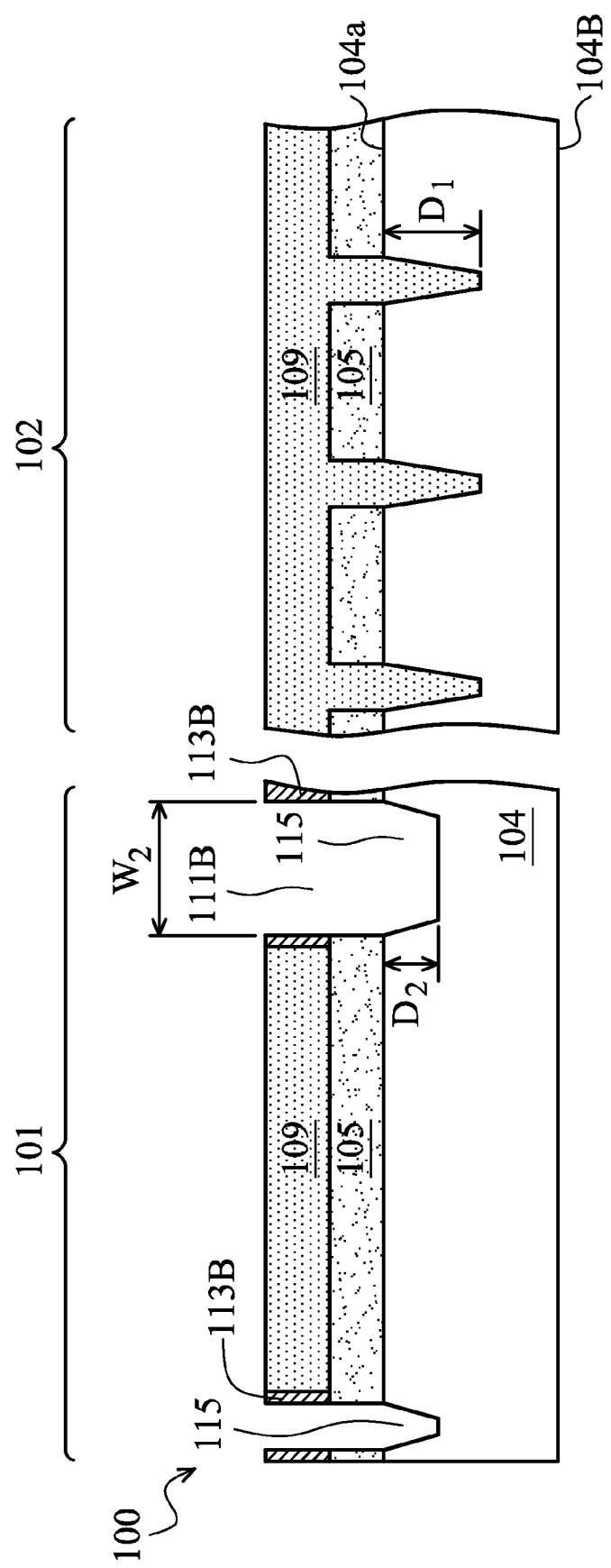

The method 200 continues with operation 204 in which a spacer is formed in an interior surface of each opening. FIGS. 5 and 6 illustrate cross-sectional views of forming a spacer. FIG. 5 is a cross-sectional view of the image sensor device 100 after a spacer layer 113A is formed on the image sensor device 100 shown in FIG. 4. The spacer layer 113 is formed on a top surface of the mask layer 109 and an interior surface of each opening 111A. The opening 111A is narrowed to be an opening 111B having a width $W_2$. The width $W_2$ is less than the width $W_1$. The spacer layer 113A may include silicon oxide, silicon nitride, silicon oxynitride, or PSG. The spacer layer 113A is formed through a process such as chemical vapor deposition (CVD), plasma enhanced chemical vapor deposition (PECVD) or high density plasma chemical vapor deposition (HDPCVD).

FIG. 6 is a cross-sectional view of the image sensor device 100 after the spacer layer 113A is etched to form spacers 113B. The spacer layer 113A is anisotropically etched to form spacers 113B in the interior surface of each opening 111B. The method 200 continues with operation 205 in the spacers 113B and the mask layer 109 are used as an etching mask to remove a portion of the hard mask layer 105 and a portion of the substrate 104 not covered by the spacers 113B and the mask layer 109. The removing process includes a dry etching process, a wet etching process, or combination thereof. The removed portion of the substrate 104 through the openings 111B form a plurality of second trenches 115 in the pixel region 101. Each of the second trenches 115 has the width $W_2$ and a depth $D_2$ extending from the front surface 104A into the substrate 104. The depth $D_2$ is in a range of about 1000 Å to about 1500 Å. The spacers 113B and the mask layer 109 are removed after the formation of second trenches 115.

Figure 7:
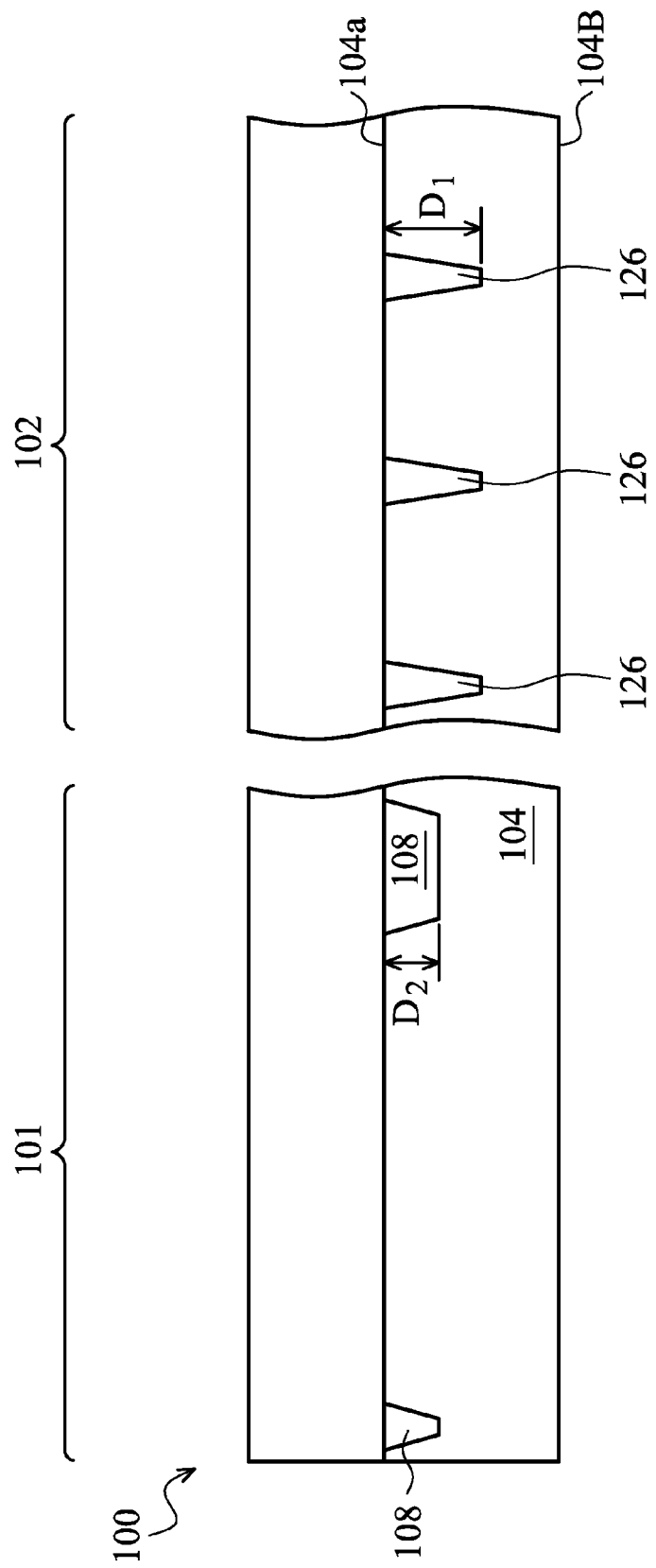

FIG. 7 is a cross-sectional view of the image sensor device 100 after a plurality of first isolation features 126 are formed in the periphery region 102 and a second isolation features 108 are formed in the pixel region 101. In at least one embodiment, a dielectric material is formed overfilling the plurality of first trenches 107B, the plurality of second trenches 115 and the hard mask layer 105. A planarization process, such as a chemical mechanical polishing (CMP) process and/or an etching process, is applied to the dielectric material to reduce a thickness of the dielectric material to expose the top surface 105A of the hard mask layer 105. The plurality of the first isolation features 126 and the second isolation features 108 are formed in the corresponding plurality of first trenches 107B and plurality of second trenches 115. In some embodiments, the hard mask layer 105 is removed after the planarization process. The first isolation features 126 and the second isolation features 108 are further planarized substantially planar to the top surface 104A of the substrate 104. The first isolation features 126 and the second isolation features 108 electrically isolate various regions in the substrate 104.

Figure 8:
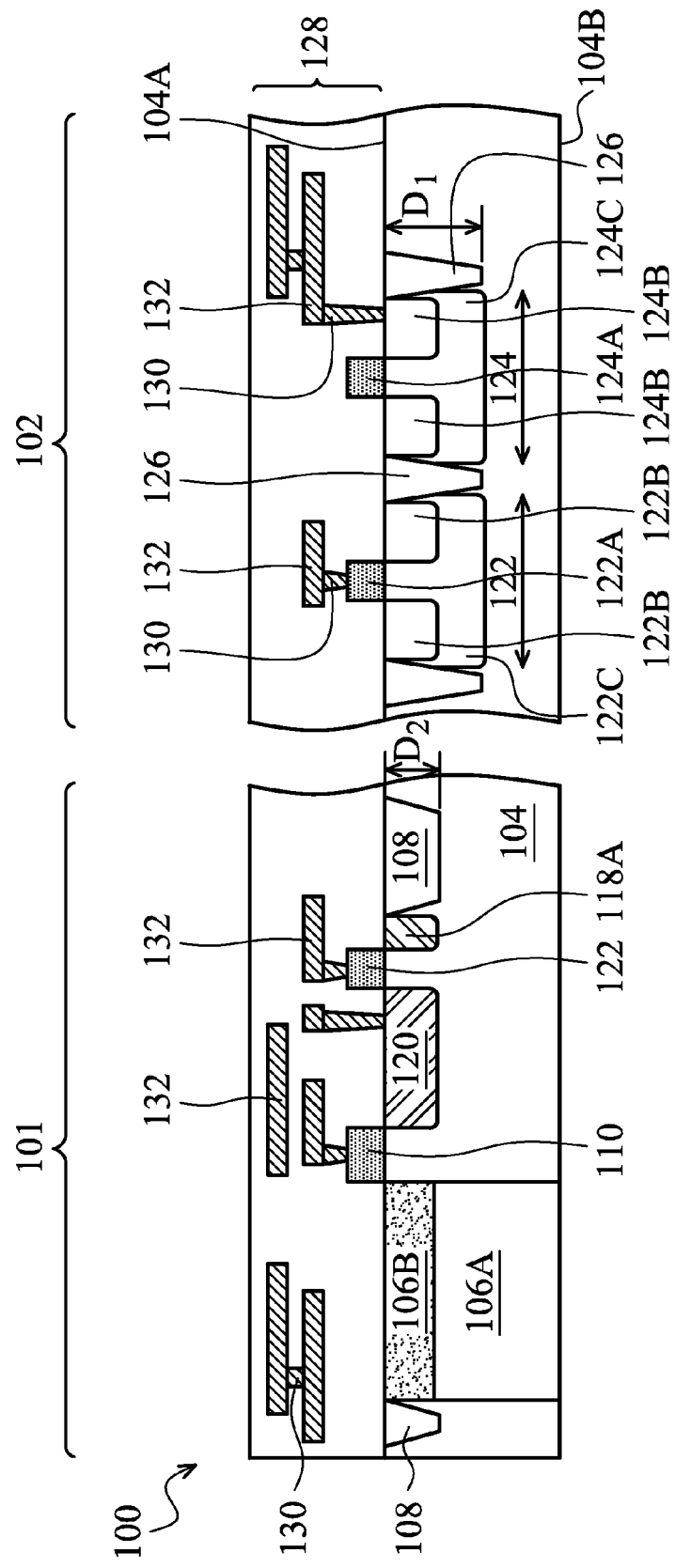

It is understood that additional steps can be provided before, during, and after the operation 205 of the method 200. For example, FIG. 8 is a cross-sectional view of the image sensor device 100 after the operation 205. At least one photodetector 106 is formed in the pixel region 101. The photodetector 106 includes a light-sensing region 106A and a pinned layer 106B. In the depicted embodiment, the light-sensing region 106A is doped with n-type species along the front surface 104A of the substrate 104. The pinned layer 106B is doped with p-type species overlapping the light-sensing region 106A at the front surface 104A of the substrate 104. A floating diffusion region 120 is formed in the pixel region 101. In the depicted embodiment, the floating diffusion region 120 is an n-type doped region.

In the periphery region 102, an n-type well 122C and a p-well 124C are formed in the substrate 104 by implantations. Source/drain regions 122B and source/drain regions 124B are formed in the corresponding n-type well 122C and p-well 124 by implantations.

A plurality of gate stacks 110, 112, 122A and 124B are formed on the front surface 104A of the substrate 104. The gate stack 110 corresponds to a transfer transistor overlying a portion of the light-sensing region 106A in the pixel region 101. The gate stack 112 corresponds to a reset transistor in the pixel region 101. The gate stacks 122A and 124B correspond to the n-type well 122C and the p-well 124C in the periphery region 102. The gate stacks 122A and source/drain regions 122B in the n-type well 122C construct a PMOS transistor. Likewise, the gate stacks 124A and source/drain regions 124B in the p-type well 124C construct a NMOS transistor. The gate stacks 110, 112, 122A and 124B are formed by suitable process, including deposition, lithography patterning, and etching processes.

The image sensor device 100 further includes a multilayer interconnect (MLI) 128 disposed over the front surface 104A of the substrate 104. The MLI 128 is coupled to various components of the image sensor device 100, such as the photodetector 106, such that the various components of the mage sensor device 100 are operable to properly respond to illuminated light (imaging radiation). The MLI 128 includes various conductive features, which may be vertical interconnects, such as contacts and/or vias 130, and horizontal interconnects, such as lines 132. The conductive features 130 and 132 are formed by suitable process, including deposition, lithography patterning, and etching processes to form vertical and horizontal interconnects.

The various conductive features 130 and 132 of the MLI 128 are disposed in an interlayer dielectric (ILD) layer 134. The ILD layer 134 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The ILD layer 134 may have a multilayer structure. The ILD layer 134 may be formed by suitable process, including spin-on coating, chemical vapor deposition (CVD) or plasma enhanced chemical vapor deposition (PECVD). In one example, the MLI 128 and the ILD layer 134 may be formed in an integrated process including a damascene process.

In some embodiments, further process steps are included after the MLI 128 formation. As illustrated in FIG. 1B, a carrier wafer 136 is bonded to the MLI 128. The carrier wafer 136 provides mechanical strength and support for processing the back surface 104B of the substrate 104. A planarization process, such as a chemical mechanical polishing (CMP) process, is applied to the back surface 104B of the substrate 104 to reduce a thickness of the substrate 104. A doped layer 138 is formed by an implantation process, diffusion process, annealing process or combinations thereof through the back surface 104B. The doped layer 138 may repair the back surface 104B damage during the planarization process, and reduce dark current and white pixels. An antireflective layer 140, a color filter 142 and a lens 144 disposed over the back surface 104B of the substrate 104 are also formed, in some embodiments. The color filter 142 and the lens 144 are aligned with the light-sensing region 106A of the photodetector 106.

In the above depicted embodiments, image sensor device 100 includes a p-type doped substrate 104. Various doping configurations for various features, such as the light-sensing regions 106A, the pinned layer 106B and the floating diffusion region 120, described above should have doping configurations consistent with forming an image sensor device in p-type doped substrate. Alternatively, image sensor device 100 may include a n-type doped substrate 104 or a n-type material in the substrate 104. Various doping configurations for various features described above should have doping configurations consistent with forming an image sensor device in n-type doped substrate.

Various embodiments of the present disclosure may be used to improve the performance of an image sensor device. For example, the spacer 113B reduces the width $W_1$ of the opening 111A to the width $W_2$ of the opening 111B in the pixel region 101. Thus, the following formed second isolation feature 108 has the reduced width $W_2$. The reduced second isolation feature 108 gains extra functional space for photodetector 106 in the pixel region 101. Furthermore, the second trenches 115 in the pixel region 101 have the depth $D_2$ less the depth $D_1$ of the first trenches 107B in the periphery region 102. In forming the second trenches 115 of the corresponding second isolation feature 108, the pixel region 101 suffers less etching damage than the periphery region 102. With less etching damages, this disclosure reduces dark current or reduces white pixel defects of the image sensor device.

One aspect of the disclosure describes a method of forming an image sensor device. A substrate includes a pixel region and a periphery region. A plurality of first trenches is etched in the periphery region. Each of the first trenches has a depth $D_1$. A mask layer is formed over the substrate. The mask layer has a plurality of openings in the pixel region. A spacer is formed in an interior surface of each opening. A plurality of second trenches is etched through each opening having the spacer in the pixel region. Each of the second trenches has a depth $D_2$. The depth $D_1$ is larger than the depth $D_2$.

A further aspect of the disclosure describes a method of forming an image sensor device. A substrate includes a front surface and a back surface, and a pixel region and a periphery region. A plurality of first trenches is etched from the front surface in the periphery region. Each of the first trenches has a depth $D_1$ into the substrate. A mask layer is formed over the front surface of the substrate. The mask layer has a plurality of openings in the pixel region. Each opening is narrowed in the mask layer. A plurality of second trenches is etched through each narrowed opening in the pixel region. Each of the second trenches has a depth $D_2$ into the substrate. The depth $D_1$ is larger than the depth $D_2$. At least one photodetector is formed in the substrate of the pixel region. The at least one photodetector is surrounded by the plurality of second trenches. A color filter and a lens are formed over the back surface of the substrate. The color filter and the lens are aligned with the least one photodetector.

The present disclosure also describes an aspect of an image sensor device. The image sensor device includes a substrate having a pixel region and a periphery region. A plurality of first isolation features is in the periphery region. Each of the first isolation features has a depth $D_1$. A plurality of second isolation features is in the pixel region. Each of the second isolation features has a depth $D_2$. The depth $D_1$ is larger than the depth $D_2$. At least one photodetector surrounded by the second isolation features is in the pixel region.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming an image sensor device, the method comprising:
    etching a plurality of first trenches in a periphery region of a substrate, each of the first trenches having a depth $D_1$;
    forming a mask layer over the substrate, the mask layer having a plurality of openings in a pixel region of the substrate;
    forming a spacer on an interior surface of each opening; and
    etching a plurality of second trenches through each opening having the spacer in the pixel region, each of the second trenches having a depth $D_2$, wherein the depth $D_1$ is larger than the depth $D_2$.

2. The method of claim 1, wherein the depth $D_1$ is in a range from about 2000 Å to about 3500 Å.

3. The method of claim 1, wherein the depth $D_2$ is in a range from about 1000 Å to about 1500 Å.

4. The method of claim 1, wherein forming the spacer comprises:
    forming a spacer layer on the interior surface of each opening in the pixel region; and
    anisotropically etching the spacer layer to form the spacer on the interior surface of each opening.

5. The method of claim 1, wherein forming the mask layer comprises:
    forming a first photo resist layer overfilling the plurality of first trenches and exposing the pixel region;
    forming a second photo resist layer on the first photo resist layer and the exposed pixel region; and
    patterning the second photo resist layer to form the plurality of openings.

6. The method of claim 1, further comprising:
    filling a dielectric material in the plurality of first trenches and the plurality of second trenches; and
    planarizing the dielectric material to form a plurality of first isolation features and a plurality of second isolation features, respectively.

7. The method of claim 6, further comprising:
    forming at least one light-sensing region in the pixel region surrounded by the plurality of second isolation features; and
    forming a pinned layer overlapping the at least one light-sensing region.

8. A method of forming an image sensor device, the method comprising:
    etching a plurality of first trenches in a periphery region of a substrate, the substrate having a front surface and a back surface, each of the first trenches having a depth $D_1$ into the substrate;
    forming a mask layer over the front surface of the substrate, the mask layer having a plurality of openings in a pixel region of the substrate;
    narrowing each opening in the mask layer by forming a spacer on an interior surface of each opening in the mask layer;
    etching a plurality of second trenches through each narrowed opening in the pixel region, each of the second trenches having a depth $D_2$ into the substrate, wherein the depth $D_1$ is larger than the depth $D_2$;
    forming at least one photodetector in the substrate of the pixel region, wherein the at least one photodetector is surrounded by the plurality of second trenches; and
    forming a color filter and a lens over the back surface of the substrate, wherein the color filter and the lens are aligned with the at least one photodetector.

9. The method of claim 8, wherein the depth $D_1$ is in a range from about 2000 Å to about 3500 Å.

10. The method of claim 8, wherein the depth $D_2$ is in a range from about 1000 Å to about 1500 Å.

11. The method of claim 8, wherein narrowing each opening comprises:
    forming a spacer layer on the interior surface of each opening in the pixel region; and
    anisotropically etching the spacer layer, to form the spacer on the interior surface of each opening.

12. The method of claim 8, further comprising:
    filling a dielectric material in the plurality of first trenches and the plurality of second trenches; and
    planarizing the dielectric material to form a plurality of first isolation features and a plurality of second isolation features, respectively.

13. The method of claim 12, further comprising:
    forming a gate stack of a transfer transistor on the front surface over a portion of the at least one photodetector.

14. The method of claim 8, further comprising:
    forming a multilayer interconnect over the front surface of the substrate,
    wherein the multilayer interconnect includes vertical conductive interconnects and horizontal conductive interconnects.

15. An image sensor device, comprising:
    a substrate having a pixel region and a periphery region;
    a first mask layer over the substrate, the first mask layer having a plurality of first openings in the pixel region, wherein each first opening has a first width;
    a second mask layer over the first mask layer, the second mask layer having a plurality of second openings, wherein each second opening has a second width, and the second width is greater than the first width;
    a spacer layer over the first mask layer, the spacer layer having a first portion on a first interior sidewall surface of each second opening and a second portion on a second interior sidewall surface of each second opening, wherein a space between the first portion of the spacer layer and the second portion of the spacer layer is about equal to the first width;
    a plurality of isolation features in the periphery region, wherein each isolation feature has a depth $D_1$;
    a plurality of trenches in the pixel region, wherein each trench has a depth $D_2$, and the depth $D_1$ is larger than the depth $D_2$; and
    at least one light-sensing region in the pixel region, the light-sensing region being surrounded by the trenches.

16. The image sensor device of claim 15, wherein the depth $D_1$ is in a range from about 2000 Å to about 3500 Å.

17. The image sensor device of claim 15, wherein the depth $D_2$ is in a range from about 1000 Å to about 1500 Å.

18. The image sensor device of claim 15, further comprising:
    a doped layer in a back surface opposite from a front surface of the substrate.

19. The image sensor device of claim 15, wherein each isolation feature of the plurality of isolation features comprises a second trench in the periphery region, each of the second trenches is filled with the second mask layer, the second mask layer overfills the second trenches in the periphery region, and the plurality of first openings together with the plurality of second openings expose the pixel region of the substrate.

20. The method of claim 1, wherein the spacer is formed on a sidewall surface and a bottom surface of each opening.

* * * * *